(12) United States Patent
Lessmann et al.

(10) Patent No.: US 9,240,560 B2
(45) Date of Patent: Jan. 19, 2016

(54) ARRAY OF SEVERAL ORGANIC SEMICONDUCTOR COMPONENTS AND METHOD FOR THE PRODUCTION THEREOF

(71) Applicants: Novaled GmbH, Dresden (DE); Technische Universitaet Dresden, Dresden (DE)

(72) Inventors: Rudolf Lessmann, Duesseldorf (DE); Hans Kleemann, Dresden (DE)

(73) Assignees: NOVALED GMBH, Dresden (DE); TECHNISCHE UNIVERSITAET DRESDEN, Dresden (DE)

( * ) Notice: Subject to any disclaimer, the term of this patent is extended or adjusted under 35 U.S.C. 154(b) by 4 days.

(21) Appl. No.: 14/374,115

(22) PCT Filed: Jan. 23, 2013

(86) PCT No.: PCT/DE2013/100022
§ 371 (c)(1),
(2) Date: Dec. 29, 2014

(87) PCT Pub. No.: WO2013/110268
PCT Pub. Date: Aug. 1, 2013

(65) Prior Publication Data
US 2015/0115238 A1 Apr. 30, 2015

(30) Foreign Application Priority Data
Jan. 26, 2012 (DE) .......................... 10 2012 100 642

(51) Int. Cl.
*H01L 51/05* (2006.01)
*H01L 27/28* (2006.01)

(52) U.S. Cl.
CPC .......... *H01L 51/0512* (2013.01); *H01L 27/283* (2013.01); *H01L 51/0508* (2013.01); *H01L 51/0562* (2013.01)

(58) Field of Classification Search
CPC . H01L 51/05; H01L 51/0504; H01L 51/0508; H01L 51/0512; H01L 51/0516; H01L 51/052; H01L 51/0541; H01L 51/0545; H01L 51/102
See application file for complete search history.

(56) References Cited

U.S. PATENT DOCUMENTS 8,071,976 B2   12/2011   Huang et al.
8,258,501 B2   9/2012    Werner et al.
(Continued)

FOREIGN PATENT DOCUMENTS

EP   1701392 A1   9/2006
EP   2180029 A1   4/2010

OTHER PUBLICATIONS

PCT International Search Report for PCT Application No. PCT/DE2013/100022 mailed May 23, 2013 (3 pages).
(Continued)

*Primary Examiner* — Eduardo A Rodela
(74) *Attorney, Agent, or Firm* — Sutherland Asbill & Brennan LLP

(57) ABSTRACT

The invention relates to an array of several semiconductor components (20, 30), comprising a layer array (40) having a first and a second semiconductor component (20, 30), each being formed in an electrode layer (34) having a drain and a source electrode (22, 23, 32, 33), a gate electrode (21, 31) in a further electrode layer, and a layer stack between the electrode layer (34) and the further electrode layer (21, 31). The invention further relates to a method for producing an array having a first and a second semiconductor component (20, 30) in a layer array (40) and to the application thereof.

7 Claims, 5 Drawing Sheets

(56) References Cited

U.S. PATENT DOCUMENTS

| | | | |
|---|---|---|---|
| 8,764,462 B2 * | 7/2014 | Dorok et al. | 439/99 |
| 2005/0040390 A1 | 2/2005 | Pfeiffer et al. | |
| 2005/0061232 A1 | 3/2005 | Werner et al. | |
| 2005/0121667 A1 | 6/2005 | Kuehl et al. | |
| 2006/0197084 A1 * | 9/2006 | Tanabe | 257/57 |
| 2007/0278479 A1 | 12/2007 | Werner et al. | |
| 2008/0265216 A1 | 10/2008 | Hartmann et al. | |
| 2009/0009071 A1 | 1/2009 | Murano et al. | |
| 2012/0181538 A1 * | 7/2012 | Kamura et al. | 257/57 |
| 2012/0211740 A1 * | 8/2012 | Muller | 257/40 |

OTHER PUBLICATIONS

PCT International Preliminary Report on Patentability for PCT Application No. PCT/DE2013/100022 mailed Aug. 7, 2014 (9 pages).

Kim et al., "Vertically Stacked Complementary Inverters with Solution-Processed Organic Semiconductors," Organic Electronics, 2011, 12:1132-1136.

* cited by examiner

ARRAY OF SEVERAL ORGANIC SEMICONDUCTOR COMPONENTS AND METHOD FOR THE PRODUCTION THEREOF

CROSS-REFERENCE TO RELATED APPLICATIONS

This is a submission pursuant to 35 U.S.C. 154(d)(4) to enter the national stage under 35 U.S.C. 371 for PCT/DE2013/100022, filed Jan. 23, 2013. Priority is claimed under 35 U.S.C. 119(a) and 35 U.S.C. 365(b) to German Application No. 10 2012 100 642.3, filed Jan. 26, 2012. The subject matters of PCT/DE2013/100022 and German Application No. 10 2012 100 642.3 are incorporated herein by reference.

The invention relates to an array of several organic semiconductor components and method for production thereof.

BACKGROUND OF THE INVENTION

In the field of semiconductor components, it is known to arrange an "injection layer" in a layer array of the component between an electrode and an oppositely positioned semiconductor layer consisting of organic material. For example, document EP 1 806 795 A1 describes an organic component having such an injection layer, particularly for a light-emitting organic component. It was found that when an injection layer is present, which consists of molecular doping materials, charge carriers can be injected more effectively into the organic semiconductor layer adjacent to the injection layer when the component is in operation.

Figure 1:
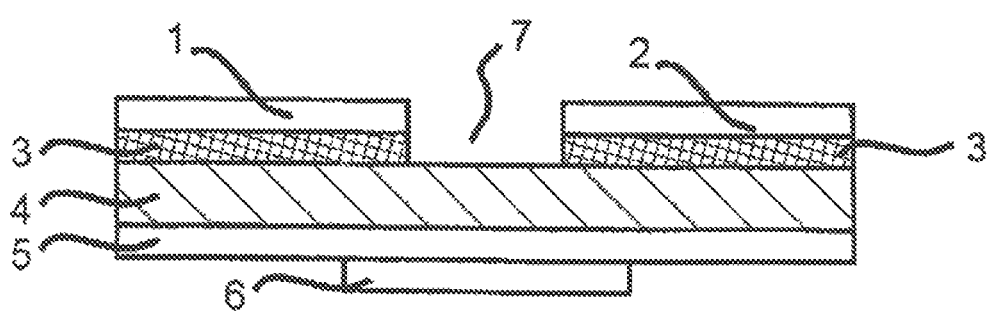

With regard to the production of such layer arrays for semiconductor components, it happens that for process engineering reasons the injection layer is formed over a larger area than is strictly necessary for the optimisation of the charge carrier injection. Consequently, in certain areas that are covered by the layer, the influence of the injection layer may not be desirable. As an example of such, FIG. 1 shows a schematic representation of an organic field effect transistor in which the drain and source electrodes 1, 2 are formed from a molecular doping material on a structured injection layer. Injection layer 3 is itself arranged in a stack with a channel layer 4 and an insulator layer 5, the latter providing coupling with the additional electrode gate 6. The structure of injection layer 3 can sometimes be very complicated. The effect of optimising the charge carrier injection provided by injection layer 3 is desirable in areas below source and drain electrodes 1, 2. On the other hand, the effect on channel layer 4 is not desirable in an intermediate area 7, where injection layer 3 would also be formed in an unstructured configuration. Consequently, injection layer 3 is usually produced in a structured configuration.

There is therefore a need for technologies that improve the use of injection layers in semiconductor components.

An organic field effect transistor is known from document DE 10 2008 036 062 A1. In one variant, the field effect transistor has a layer array with an active layer, on which a partial layer of a matrix material is formed, so that portions of the active layer are covered by the partial layer. The partial layer itself is then covered by a charge carrier injection layer, which is in direct contact with the active layer outside of the area of the partial layer. Electrodes of the transistor are positioned on the charge carrier injection layer.

A semiconductor component with a layer array is disclosed in document DE 10 2010 031 979 A1. The layer array comprises an electrode, a semiconductor layer made from an organic material, an injection layer consisting of a molecular doping material which is an electrical doping agent for the organic material of the semiconductor layer, and an additive layer. Upon coming into contact with the molecular doping material, the material of the additive layer alters the doping affinity thereof in respect of the organic material of the semiconductor layer.

SUMMARY OF THE INVENTION

The object of the invention is to create an improved array comprising multiple organic semiconductors and a production method therefor, in which the options for using injection layers in order to inject charge carriers and the application-specific creation thereof are optimised. The production method should also be simplified.

This object is solved according to the invention with an array comprising multiple organic semiconductor components as described herein, and a method for producing an array comprising multiple organic semiconductor components as described herein. Moreover, the use of the array is envisaged in various devices as described herein.

It is envisioned to form at least some of the layers of both organic semiconductor components both in the area of the first organic semiconductor component and in the area of the second. As a result, it is not necessary to structure these layers in the dimensioning range of the individual semiconductor component, and in particular not necessary to restrict a layer to the area of a semiconductor component or a portion thereof. Instead, one or more of the layers in the layer stack extend beyond the respectively assigned semiconductor component between the electrode layers and into the area of the adjacent semiconductor component without negatively affecting the functionality of the adjacent component. The structuring work that is required during production of the array with the multiple semiconductor components is reduced thereby.

The organic semiconductor components are preferably formed side by side in the layer array, more preferably in a direction, parallel to the plane of a substrate on which the layer array is produced.

The source and drain electrodes for both semiconductor components are produced in a shared electrode layer, and are arranged at a distance from one another in the respective semiconductor component. It may be provided that the source electrode of one of the two semiconductor components is electrically connected to the drain electrode of the other of the two components. Alternatively, the respective source electrodes of the two semiconductor components and/or the respective drain electrodes of the two semiconductor components may be electrically connected to each other. In this context, it is preferable if the two electrodes that are arranged next to each other in the shared electrode layer are electrically connected to each other.

An injection layer for each of the corresponding charge carriers is arranged on both sides of the shared electrode layer in both organic semiconductor components, wherein the injection layer of the first semiconductor component contains a p-type electrical dopant, and the injection layer of the second semiconductor component contains an n-type electrical dopant.

Both molecular doping materials are also electrical dopants for the organic material of the semi-conductor adjacent to the respective injection layer. Since the injection layers of the two semi-conductor components come into contact with one another in the respective area between the source electrode and the drain electrode, each influences the doping affinity of the electrical dopant of the other regarding to the respectively assigned organic material in the semiconductor layer adjacent to the injection layer.

The electrical dopants also have the effect of compensating for the doping effect of the other electrical dopant. Consequently, areas are then created in both injection layers with a doping affinity that differs from the dopants that are present. Whereas the doping affinity is altered by the mutual effects of the electrical dopants, particularly in the areas of the injection layer adjacent to the intermediate area between the respective drain and the respective source electrode, the doping affinity outside of these areas remains substantially unchanged by the influence of the other electrical dopant.

With this invention, it is now possible to create a type of structuring in the injection layers, so that areas with a first doping affinity and areas with a second doping affinity are created, wherein the second doping affinity of the molecular doping material of the additive layer with regard to the organic material of the organic semiconductor layer adjacent thereto is weaker than the first doping affinity. The molecular doping material may be an organic or an inorganic doping material.

The invention has the advantage that a lateral conductivity, which is enabled by the respective injection layer, is reduced, because boundary surface doping is reduced. Accordingly, crosstalking is also avoided. In the known component shown in FIG. 1, which unlike the array suggested here also comprises only one semiconductor component, the injection layer would be chemically deactivated in the middle area, so that local conductivity would be entirely suppressed.

Advantageous results are achieved with undoped semiconductor layers. The suggested technology can be implemented particularly efficiently in very compact geometries, where the lateral separation between electrodes is smaller than 50 µm, preferably smaller than 10 µm.

The doping affinity of the molecular doping material serves as a reference for the extent to which the molecular doping material in the respective area of the injection layer really enables electrical doping (or injection improvement) of the organic material in areas of the organic semiconductor layer that are adjacent thereto. The doping affinity is proportional to the spatial density of free dopants in the material. The electrical doping is based on a partial charge transfer between the doping material and the organic material of the organic semiconductor layer, in which case the latter constitutes the "matrix material".

The injection layer serves generally to improve the injection of charge carriers in the component. The boundary surface between the injection layer and the organic semiconductor layer below it is preferably of continuous construction, in particular not interrupted by the intermediate layer, which in turn is arranged above the injection layer, that is to say on the side of the injection layer facing away from the organic semiconductor layer and towards the electrode or electrodes. In this respect, the additive layer is then free from direct contact with the organic semiconductor layer. The material has an indirect (inhibiting) influence on the electrical doping effect of the injection layer material into the organic semiconductor layer.

The suggested technology improves the components in the sense that the doping effect does not take place inadvertently due to undesirable doping or unintended diffusion. In the layer areas of the respective injection layer with the first doping affinity, the molecular doping material of the injection layer can exercise its function of improving the injection between the electrode and the adjacent organic semiconductor layer without interference from the other (complementary) molecular doping material from the other semiconductor component. On the other hand, the molecular doping material present in the other layer areas, which are formed next to the boundary surface areas inhibits the effect of the molecular doping material from the injection layer in terms of undesirable electrical doping of the adjacent organic material in the organic semiconductor layer. This can result in complete inhibition (neutralisation) of an electrical doping effect, at least in parts of said additional layer areas.

This makes it possible to form layer areas in the injection layer that have different doping effects for the material of the adjacent organic semiconductor layer. In the case of the organic field effect transistor, this means for example that an electrical doping effect of the injection layer material in an area of the injection layer between adjacent electrodes of the transistor may be reduced or completely neutralised for the adjacent channel layer.

One measure of the undesirable electrical doping effect of the molecular doping material originating from the injection layer in the areas with lower doping affinity for the material of the adjacent organic semiconductor layer is for example the extent to which molecules of the molecular doping material penetrate the adjacent organic semiconductor layer so that localised electrical doping of the molecules of the organic material of the organic semiconductor layer is able to occur. This infiltration effect is inhibited or entirely suppressed with the aid of the material of the additive layer. It is very easy to define material combinations and layer thickness variations experimentally so that the doping affinity is influenced. All that is needed is to apply corresponding layers of the materials to be investigated, and then compare the current flow for different layer structures when a voltage is applied.

Molecular doping materials for the injection layer are molecular substances that can be precipitated to form layers by means of vacuum evaporation without decomposition as a layer (solids).

These may also be organic or inorganic substances, the molecules of which include at least six atoms, preferably more than 20 atoms. Covalent compounds are preferred.

For example, doping materials may be the following compounds: p-dopants in DE 103 57 044 (corresponding to US 2005/121667), US 2008/265216, EP 2 180 029 A1; n-dopants in DE 103 47 856 (corresponding to WO 05/036667), DE 10 2004 010 954 (corresponding to WO 05/086251), or precursor compounds such as are described in DE 103 07 125 (corresponding to US 2005/040390) or DE10338406 (corresponding to US 2005/061232). It may be advantageous if the LUMO of a p-dopant (HOMO of the n-dopant) for a p-doping (n-doping) is not more than 0.5 eV greater (is not more than 0.5 eV less than) the HOMO (LUMO) of a p-type (n-type) matrix. Similarly, it is advantageous if the HOMO for an n-doping of an n-dopant is not more than 0.5 eV less than the LUMO of an n-type matrix. In this context, the variables HOMO and LUMO are conventionally considered to be quantitatively equivalent to the ionisation potential or electron affinity, but with an opposite sign.

Examples of p-dopant/p-matrix pairs are: copper phthalocyanine (CuPc), HOMO~−5.2 eV, doped with tetrafluorotetracyanoquinone dimethane (F4TCNQ), with LUMO~−5.2 eV; pentacene doped with F6-TNAP. Examples of p-dopant/n-matrix pairs are also: fullerene C60 doped with acridine orange base (AOB), perylene-3,4,9,10-tetracarboxylic-3,4,9, 10-dianhydride (PTCDA) doped with leuco crystal violet: fullerene C60 doped with tetrakis(1,3,4,6,7,8-hexahydro-2H-pyrimido[1,2-a]pyrimidinato)ditungsten (II) (W(hpp)4).

It is preferred if the respective material of the injection layers is electrically neutral in the areas in which the it is in contact with the materials of the injection layers of the semiconductor components.

The number of molecules (N) in a volume (V) may be determined with the known density (p) the molecular mass ($m_w$), wherein $N_A$ is the Avogadro constant.

$$N = \frac{p^V}{N_A m_w}$$

Since the surface in the reaction area is the same, the equation only depends on the layer thickness. Thus, the number of molecules can be calculated for both layers using the following two equations:

$$N_{AL} = \frac{p_{AL}}{m_{wAL}} = \frac{d_{AL}}{N_A}$$

$$N_{IL} = \frac{p_{IL}}{m_{wm}} = \frac{d_{IL}}{N_A}$$

in which IL is the index for the injection layer and AL is the index for the additive layer. The following applies: $N_{AL} \geq N_{IL}$. In this context, the lower limit is in the order of $N_{AL} \geq 0.5\ N_{IL}$. Preferably, a slight excess of AL is provided: $N_{AL} \geq 1.5\ N_{IL}$ In order to complete the reaction, the boundary area between the two materials must be large, which can be achieved with very thin layers. It is preferred that the nominal layer thickness of the injection layer is not more than 5 nm, more preferably not more than 1.5 nm. The layer thickness is a nominal layer thickness. This is calculated from the mass that is deposited on a known surface area. To do this, the density of the material is used. For example, the layer thickness when producing the layer by means of VTE ("Vacuum Thermal Evaporation") is the thickness that is displayed on the layer thickness monitor. If the layer thickness is measured directly, with a profilometer, for example, an average layer thickness can also be determined, in the case of very rough layers, for example.

A preferred refinement of the invention provides that the injection layer of the first semi-conductor component consists of the p-type electrical dopant and/or that the injection layer of the second semiconductor component consists of the n-type electrical dopant. If the injection layer consists of an n-type dopant of the second semiconductor component and the injection layer of the first semiconductor component contains or consists of a p-type dopant, the LUMO of the p-type dopant is preferably lower (more negative) than the LUMO of the injection layer of the second semiconductor component, more preferably >1 eV lower. If the injection layer of the first semiconductor component consists of a p-type dopant and the injection layer of the second semi-conductor component contains or consists of an n-type dopant, the HOMO of the n-type dopant is preferably higher (more positive) than the HOMO of the injection layer of the first semiconductor component, more preferably >1 eV higher. In both cases, it is preferred that the energy difference between the HOMO of the n-type dopant and the LUMO of the p-type dopant is greater than the gap (energetic space) of the semiconductor layer made from organic material, preferably greater than 2 eV.

In a practical variant of the invention, it may be provided that the molecular doping material in the injection layer of the first semiconductor component and/or the injection layer of the second semiconductor component has a molecular weight of at least 300 g/mol.

An advantageous embodiment of the invention provides that the doping affinity is reduced as a result of a chemical reaction between the p- and n-type electrical dopants. The molecular doping material and the additive material from the additive layer react with each other chemically, creating one or more new chemical compounds that do not have the same doping strength and/or the electrical conductivity of the original molecular doping material. In this and other embodiments, the additive material functions as a kind of neutralising or compensating material with regard to the doping strength of the molecular doping material in the injection layer.

A further development of the invention preferably provides that the doping affinity is reduced because of the formation of salt between p- and n-type electrical dopants.

In an advantageous variant of the invention, it may be provided that the injection layer essentially fully covers the shared electrode layer in the first and/or second semiconductor component.

The semiconductor layer is preferably of undoped (not electrically doped) construction. Regarding the method for producing a semiconductor component, it is preferable that the semiconductor layer is formed from an undoped semiconductor material.

It is also preferred that the doping material is not metallic (except for metal compounds that do not release any metals), and/or contain no free metal atoms or metal clusters, thereby particularly avoiding undesirable electrical conductivity. It is further preferred that the doping material and the material of the additive material contain no metals.

Regarding the method for producing an array that comprises a first and a second semiconductor component in a layer array, the variant possibilities described in the context of the array with multiple semiconductor components and the advantages associated therewith apply correspondingly.

DESCRIPTION OF PREFERRED EMBODIMENTS OF THE INVENTION

Figure 2:
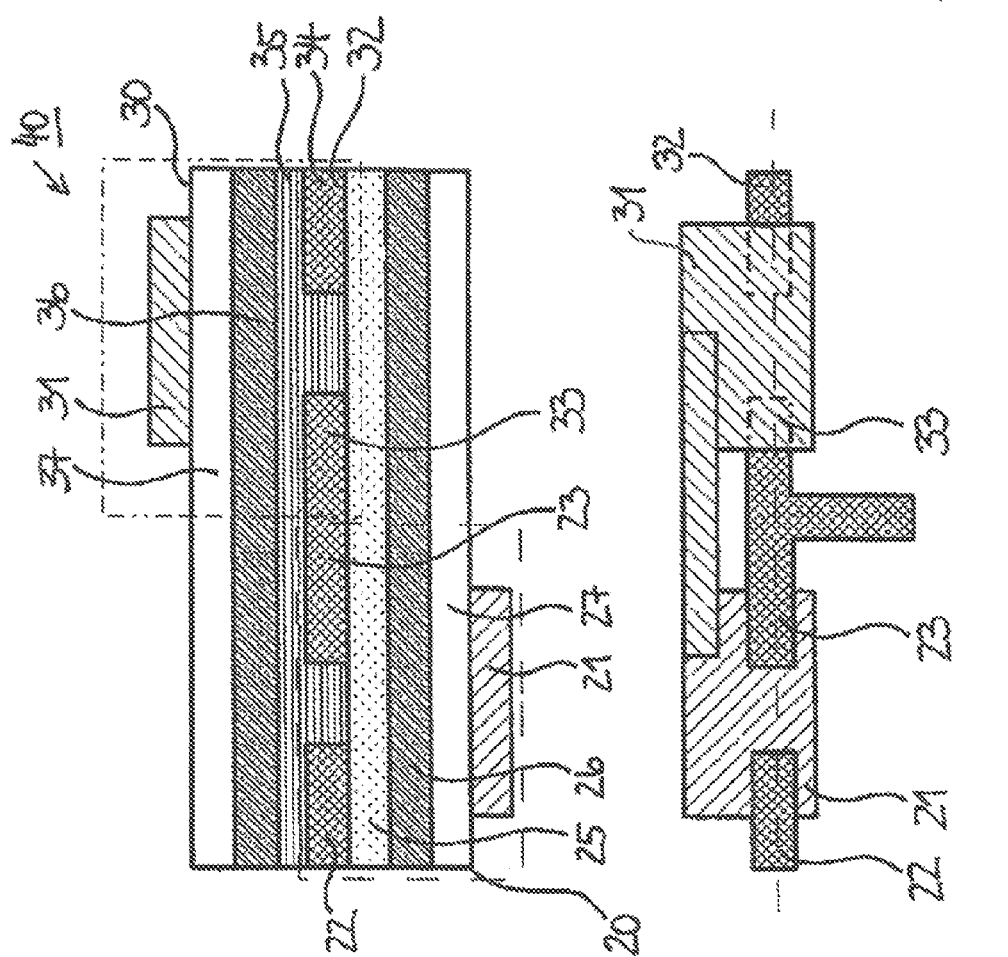
Figure 3:
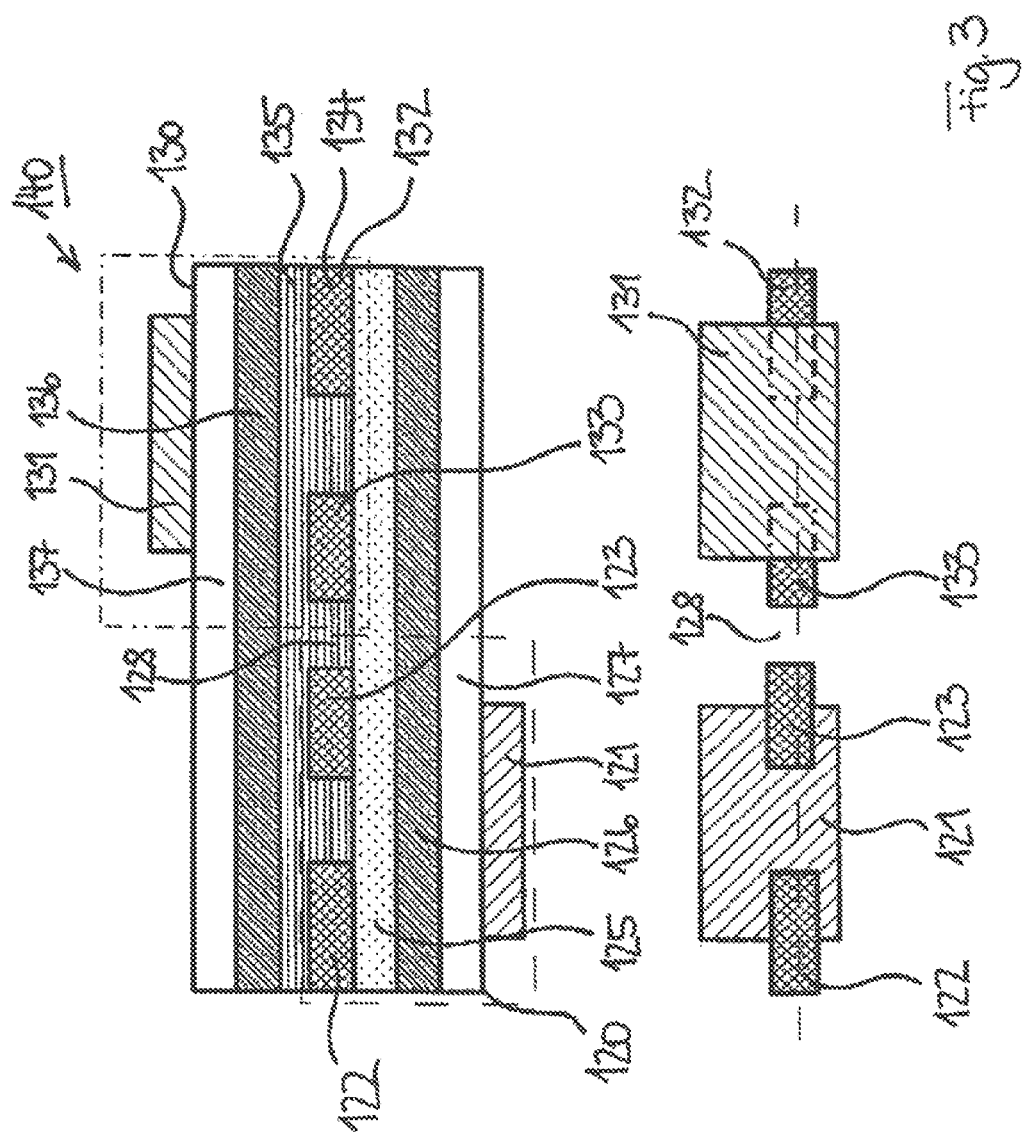
Figure 4:
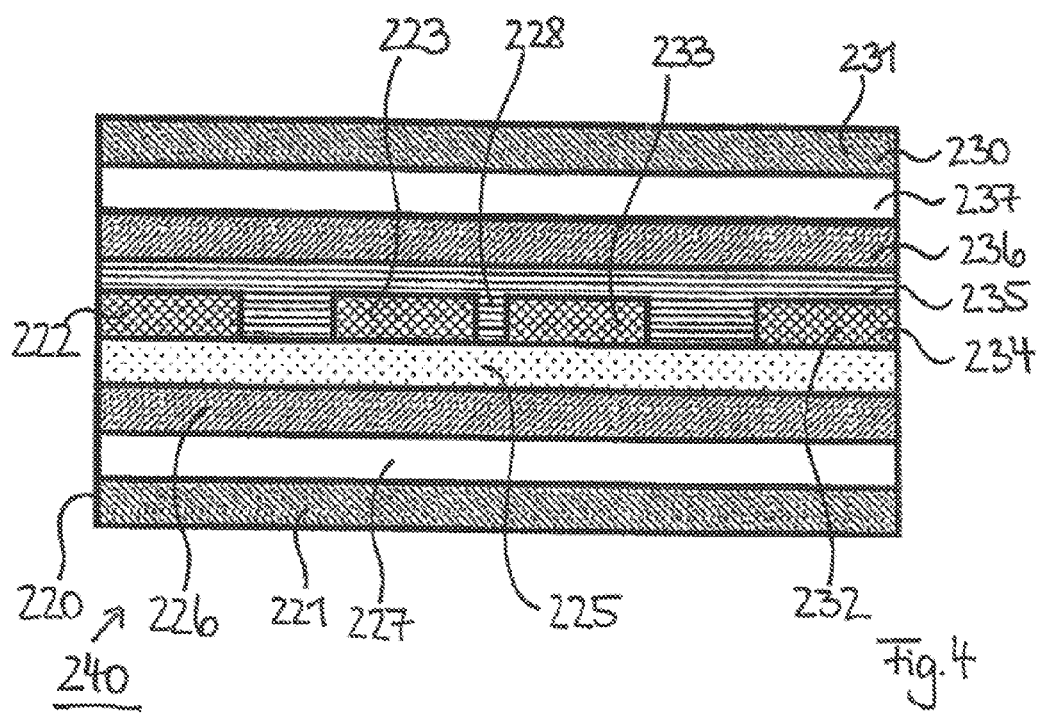
Figure 5:
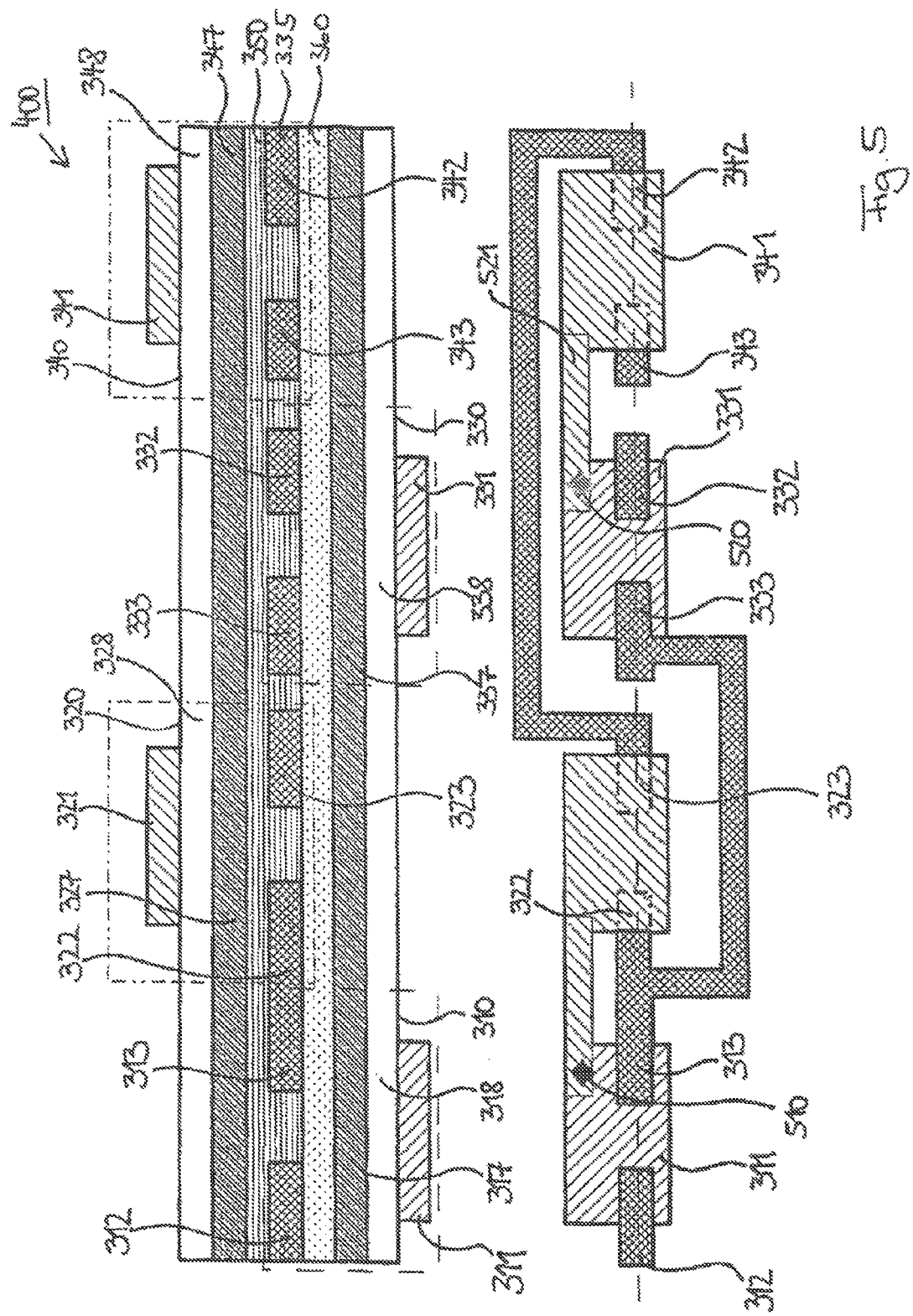

In the following, the invention will be explained in greater detail on the basis of preferred embodiments thereof and with reference to the figures of a drawing. In the drawing:

FIG. 1 is a schematic representation of a field effect transistor according to prior art, FIG. 2 is a schematic representation of an array with two semiconductor components that are formed side by side in a layer array, FIG. 3 is a schematic representation of another array with two semiconductor components that are formed side by side in a layer array, FIG. 4 is a schematic representation of another array with two semiconductor components that are formed side by side in a layer array, and FIG. 5 is a schematic representation of an array with semiconductor components that together form a NAND gate.

FIG. 2 is a schematic representation of an array with two semiconductor components 20, 30 that are formed side by side in a layer array 40.

Both the first and second semiconductor components 20, 30 are furnished with a gate electrode 21, 31, as well as one drain electrode and one source electrode 22, 23, 32, 33, wherein the drain and source electrodes 22, 23, 32, 33 are produced in a shared electrode layer 34.

The upper and lower surfaces of shared electrode layer 34 with gate and source electrodes 22, 23, 32, 33 are each covered with an injection layer 25, 35. Injection layer 25 of first semiconductor component 20 is electrically doped with a p-type electrical dopant. Injection layer 35 of second semiconductor component 30 is electrically doped with a n-type electrical dopant.

Accordingly, the two semiconductor components 20, 30 are each furnished with an organic semiconductor layer 26, 36 and an insulator layer 27, 37 that insulates the respective gate electrode 21, 31.

As is shown clearly in FIG. 2, the layer stacks that are formed between gate electrodes 21, 31 and the shared electrode layer 34 for each of the two semiconductor components 20, 30 are formed through the areas of layer array 40 that are assigned to the two semiconductor components 20, 30. Thus, they are produced as continuous layers across both semiconductor components 20, 30. Therefore, it is not necessary to structure these layers in the dimensioning of the individual s semiconductor component, and the structuring effort is reduced thereby.

The bottom part of FIG. 2 shows a plan view, also schematically, of the electrodes of the array with semiconductor components 20, 30.

FIG. 3 shows a schematic representation of another array with two semiconductor components 120, 130 that are formed side by side in a layer array 140. In this case also, both the first and the second semiconductor components 120, 130 are equipped with a gate electrode 121, 131, and one drain and one source electrode 122, 123, 132, 133 each, wherein the drain and the source electrodes 122, 123, 132, 133 are again produced in a shared electrode layer 134.

The upper and lower surfaces of shared electrode layer 134 with drain and source electrodes 122, 123, 132, 133 are each covered with a respective injection layer 125, 135. Injection layer 125 of first semiconductor component 120 is electrically doped with a p-type electrical dopant. Injection layer 135 of second semiconductor component 130 is electrically doped with a n-type electrical dopant.

Accordingly, the two semiconductor components 120, 130 are each furnished with an organic semiconductor layer 126, 136 and an insulator layer 127, 137 that electrically insulates the respective gate electrode 121, 131.

As is shown clearly in FIG. 3, the layer stacks that are formed between gate electrodes 121, 131 and the shared electrode layer 134 for each of the two semiconductor components 120, 130 are formed through the areas of layer array 140 that are assigned to the two semiconductor components 120, 130. Thus, here too they are produced as continuous layers across both semiconductor components 120, 130.

Unlike the embodiment of FIG. 2, an intermediate space 128 is formed between the source electrodes 123, 133, and this is filled with the material of injection layer 135 of second semiconductor component 130.

FIG. 4 shows a schematic representation of another array with two semiconductor components 220, 230, that are formed side by side in a layer array 240. Both the first and the second semi-conductor components 220, 230 are equipped with a gate electrode 221, 231, and one drain and one source electrode 222, 223, 232, 233 each, wherein the drain and the source electrodes 222, 223, 232, 233 are produced in a shared electrode layer 234.

The upper and lower surfaces of shared electrode layer 234 with gate and source electrodes 222, 223, 232, 233 are each covered with a respective injection layer 225, 235. Injection layer 225 of first semiconductor component 220 is electrically doped with a p-type electrical dopant. Injection layer 235 of second semiconductor component 230 is electrically doped with a n-type electrical dopant.

Accordingly, the two semiconductor components 220, 230 are each furnished with an organic semiconductor layer 226, 236 and an insulator layer 227, 237 that electrically insulates the respective gate electrode 221, 231.

An intermediate space 228 is formed between the source electrodes 223, 233, and this is filled with the material of injection layer 235 of second semiconductor component 230.

As is shown clearly in FIG. 4, the layer stacks that are formed between gate electrodes 221, 231 and the shared electrode layer 234 for each of the two semiconductor components 220, 230 are formed through the areas of layer array 240 that are assigned to the two semiconductor components 220, 230. Thus, they are produced as continuous layers across both semiconductor components 220, 230.

Unlike the embodiments of FIGS. 2 and 3, in the array of FIG. 4 the layers with the gate electrodes 221, 231 are formed through the area of both semiconductor components 220, 230.

FIG. 5 shows a schematic representation of an array with semiconductor components in a layer array 400, with which a NAND gate is formed.

Four semiconductor components 310, . . . , 340 are formed side by side in layer array 400. Each of semiconductor components 310, . . . , 340 is furnished with a gate electrode 311, . . . , 341 as well as one drain and one source electrode 312, . . . , 342, 313, . . . , 343, wherein here too a shared electrode layer 335 is produced.

The upper and lower surfaces of shared electrode layer 335 are each covered with a respective injection layer 350, 360, injection layer 350 is electrically doped with a p-type electrical dopant. Injection layer 360 is electrically doped with a n-type electrical dopant. Accordingly, the semi-conductor components are furnished with an uninterrupted semiconductor layer 317, . . . , 347, and an insulator layer 318, . . . , 348, that insulates the respective gate electrode 318, . . . , 348.

The bottom part of FIG. 5 is a schematic representation of the electrical connection of the electrodes, similar to the illustrations in FIGS. 2 and 3. In the embodiment shown, devices called vias 510, 520 are used connect electrodes of adjacent semiconductor components through the layer array. In other embodiments (not shown) the electrical connection may also be created between the electrodes in another manner, for example by means of conductor paths, at least parts of which extend outside of layer array 400.

In one configuration, gate electrode 341 and a connector 521 originating therefrom between gate electrode 341 and electrical via 520 are created in a single layer. Electrical connector 521 is then produced in the same production step in which gate electrode 341 is formed through common material deposition. During the production of this individual layer with gate electrode 341 and connector 521, a hole is formed in the stack with layers 337, 317, 360 . . . , for via 520, so that the electrically conductive material that is deposited to form gate electrode 341 and connector 521 also gets into the hole, thereby creating via 520.

In one embodiment, layer array 400 has a structure with the following layers from the bottom up, wherein a substrate of glass is used as a base for the layer stack (see also layer arrays in FIGS. 2 to 5): Au (40 nm), Al2O3 (23 nm), Pentacene (25 nm), 22-(perfluoronaphthalene-2,6-diylidene)dimalononitrile (F6-TNAP) (2 nm), Au (40 nm), W(hpp)4 (2 nm), C60 (25 nm), Al2O3 (23 nm), Au (40 nm).

The Al2O3 layers may be produced for example by "Atomic Laser Deposition" (ALD). All other layers can also by conventional methods, for example by "Vacuum Thermal Evaporation" (VTE).

To investigate the influence of the doping affinity of the molecular doping material in the injection layers, layer arrays with (only) one semiconductor component (transistor) were produced and tested. The information obtained thereby can now be applied to the arrays with multiple semiconductor components.

Transistors were produced with a layer array having an electrode consisting of an electrode material, an organic semiconductor layer consisting of organic material, an injection layer that is arranged between the electrode and the organic semiconductor layer and consists of a molecular doping material which is an electrical dopant for the organic material, and an additive layer that is arranged on the side of the injection layer facing the electrode and consists of an additive material, and which upon coming into contact with the molecular doping material, alters the doping affinity thereof in respect of the organic material of the organic semiconductor layer.

In the following, exemplary embodiments of transistors will be described.

Example 1

Transistor without Injection Layer (Prior Art for Comparison Purposes)

A transistor was provided as follows: A substrate with an ITO gate electrode was coated with an 800 nm thickness of PMMA. The PMMA layer was produced by spin coating from a solution of THF. Other standard gate electrodes and gate isolators might also be used here. A 50 nm thick Pentacene semiconductor layer was formed on the PMMA layer. The Au electrodes were created on the semiconductor layer so that the channel was 100 µm wide and 1 cm long.

A reverse current of 3.8E-11 and an on/off ratio at 60V of 1.66E4 were measured. The mobility was calculated as 0.003 $cm^2/Vs$.

Example 2

Transistor with Injection Layer

A transistor was produced as in example 1, except that an injection layer of dicyano-2,3,5,6,7,8-hexafluoro-1,4-naphtahquinonediimine with thickness of 0.5 nm was used on the semiconductor layer and under the electrodes. An elevated reverse current of 2.2E-10 and elevated on/off ratio at 60V of 6.63E4 were measured. The mobility was calculated as 0.07 $cm^2/Vs$. Very similar results were obtained with an injection layer made from 22-(perfluoronaphthalene-2,6-diylidene)dimalononitrile.

Example 3

Transistor with Injection Layer and Additive Layer

A transistor was produced as in example 2, except that an additive layer of tetrakis(1,3,4,6,7,8-hexahydro-2H-pyrimido[1,2-a]pyrimidinato)ditungsten with thickness of 0.5 nm was used on the semiconductor layer and on the electrodes. A reduced reverse current of 1E-10 and elevated on/off ratio at 60V of 1.3E5 were measured for the transistor. The mobility was calculated as 0.06 $cm^2/Vs$.

Example 4

Example 3 was repeated with a 1 nm thick injection layer. A reverse current of 2.5E-10 and an on/off ratio at 60V of 7.2E4 were measured for the transistor. The mobility was calculated as 0.07 $cm^2/Vs$.

Example 5

Example 4 was repeated with a 1 nm thick additive layer. A lower reverse current of 5.6E-11 and an on/off ratio at 60V of 2.3E5 were measured for the transistor. The mobility was calculated as 0.05 $cm^2/Vs$.

Example 6

Example 4 was repeated with a 1 nm thick injection layer of bis(2,2':6',2"-terpyridine)ruthenium and a 1 nm thick additive layer of F4TCNQ. A lower reverse current of 4E-11 and an on/off ratio at 60V of 3E5 were measured for the transistor. The mobility was calculated as 0.05 $cm^2/Vs$.

The examples were also repeated with other electrodes. An improvement of up to two orders of magnitude in the on/off ratio was measured with Al.

Similar results were achieved with transistors having a channel width of less than 10 µm. The on/off ratio showed a marked improvement compared with the prior art.

The source and drain electrodes are typically very long, since they are designed in the form of a finger.

A circuit with multiple transistors that are configured as a logic gate is also provided. Preferably, a NAND gate and/or a NOR gate is created in the layer array by means of the semiconductor components.

Features of the invention disclosed in the preceding description, and in the claims and the drawing may be significant for the realisation of the invention in various embodiments either individually or in any combination.

The invention claimed is:

1. An array of several semiconductor components comprising a layer array, wherein the layer array comprises a first semiconductor component and a second semiconductor component, wherein each of the first semiconductor component and the second semiconductor component comprises a first electrode layer having a drain electrode and a source electrode, a second electrode layer having a gate electrode, and a layer stack arranged between the first electrode layer and the second electrode layer, wherein the first semiconductor component is arranged in a first component area and the second semiconductor component is arranged in a second component area of the layer array, the first electrode layers of the first semiconductor component and the second semiconductor component are a shared electrode layer in which the drain electrodes and source electrodes are disposed for the first semiconductor component and the second semiconductor component, the layer stacks of the first semiconductor component and the second semiconductor component each comprise a semiconductor layer of a first organic material and an injection layer of a second organic material which is arranged between the semiconductor layer of the first organic material and the shared electrode layer, wherein each injection layer comprises a molecular doping material, which is an electrical p-type dopant for the second organic material of the injection layer in the first semiconductor component, and an electrical n-type dopant for the second organic material of the injection layer in the second semiconductor component, the injection layers of the first semiconductor component and the second semiconductor component each comprise one layer area having a first doping affinity of the molecular doping material with respect to the first organic material, and a second layer area having a second, weaker doping affinity of the molecular doping material with respect to the first organic material, because the injection layers are in contact in the area between the drain and the source electrodes of the first semiconductor component and in the area between the drain and the source electrodes of the second semiconductor component, so that at least in the contact areas between the drain and the source electrodes the electrical p-type dopant alters the doping affinity of the electrical n-type dopant with regard to the first organic material of the semiconductor layer in the second semiconductor component, and the electrical n-type dopant alters the doping affinity of the electrical p-type dopant with regard to the first organic material of the semiconductor layer in the first semiconductor component, and at least one of the following layers in the layer array extends into the first component area and second component area: the injection layer of the first semiconductor component, the injection layer of the second semiconductor component, the semiconductor layer of the first semiconductor component and the semi-conductor layer of the second semiconductor component.

2. The array according to claim 1, wherein the molecular doping material in the injection layer of the first semiconductor component or in the injection layer of the second semiconductor component has a molecular weight of at least 300 g/mol.

3. The array according to claim 1, wherein the doping affinity is reduced due to a chemical reaction between the electrical p-type and n-type dopants.

4. The array according to claim 1, wherein the doping affinity is reduced due to the formation of salt between the electrical p-type and n-type dopants.

5. The array according to claim 1, wherein the injection layer essentially completely covers the shared electrode layer in at least one of the first and/or second semiconductor component.

6. A device comprising the array according to claim 1, wherein the device is an organic transistor, a logic circuit, an active matrix display, or a passive matrix display.

7. An array of several semiconductor components comprising a layer array, wherein the layer array comprises a first semiconductor component and a second semiconductor component, wherein each of the first semiconductor component and the second semiconductor component comprises a first electrode layer having a drain electrode and a source electrode, a second electrode layer having a gate electrode, and a layer stack arranged between the first electrode layer and the second electrode layer, wherein the first semiconductor component is arranged in a first component area and the second semiconductor component is arranged in a second component area of the layer array, the first electrode layers of the first semiconductor component and the second semiconductor component are a shared electrode layer in which the drain electrodes and source electrodes are disposed for the first semiconductor component and the second semiconductor component, the layer stacks of the first semiconductor component and the second semiconductor component each comprise a semiconductor layer of a first organic material and an injection layer of a second organic material which is arranged between the semiconductor layer of the first organic material and the shared electrode layer, wherein each injection layer consists of a molecular doping material, which is an electrical p-type dopant in the first semiconductor component, and an electrical n-type dopant in the second semiconductor component, the injection layers of the first semiconductor component and the second semiconductor component each comprise one layer area having a first doping affinity of the molecular doping material with respect to the first organic material, and a second layer area having a second, weaker doping affinity of the molecular doping material with respect to the first organic material, because the injection layers are in contact in the area between the drain and the source electrodes of the first semiconductor component and in the area between the drain and the source electrodes of the second semiconductor component, so that at least in the contact areas between the drain and the source electrodes the electrical p-type dopant alters the doping affinity of the electrical n-type dopant with regard to the first organic material of the semiconductor layer in the second semiconductor component, and the electrical n-type dopant alters the doping affinity of the electrical p-type dopant with regard to the first organic material of the semiconductor layer in the first semiconductor component, and at least one of the following layers in the layer array extends into the first component area and second component area: the injection layer of the first semiconductor component, the injection layer of the second semiconductor component, the semiconductor layer of the first semiconductor component and the semi-conductor layer of the second semiconductor component.

* * * * *